United States Patent
Ding et al.

(10) Patent No.: US 11,011,534 B2
(45) Date of Patent: May 18, 2021

(54) MULTI-LEVEL CELL THIN-FILM TRANSISTOR MEMORY AND METHOD OF FABRICATING THE SAME

(71) Applicant: FUDAN UNIVERSITY, Shanghai (CN)

(72) Inventors: Shijin Ding, Shanghai (CN); Shibing Qian, Shanghai (CN); Wenjun Liu, Shanghai (CN); Wei Zhang, Shanghai (CN)

(73) Assignee: Fudan University, Shanghai (CN)

( * ) Notice: Subject to any disclaimer, the term of this patent is extended or adjusted under 35 U.S.C. 154(b) by 4 days.

(21) Appl. No.: 16/482,121

(22) PCT Filed: Dec. 29, 2017

(86) PCT No.: PCT/CN2017/119769
§ 371 (c)(1),
(2) Date: Jul. 30, 2019

(87) PCT Pub. No.: WO2019/007009
PCT Pub. Date: Jan. 10, 2019

(65) Prior Publication Data
US 2020/0119033 A1  Apr. 16, 2020

(30) Foreign Application Priority Data
Jul. 4, 2017 (CN) .......................... 201710538920.2

(51) Int. Cl.
*H01L 27/11568* (2017.01)
*H01L 29/423* (2006.01)
(Continued)

(52) U.S. Cl.
CPC .... *H01L 27/11568* (2013.01); *G11C 11/5671* (2013.01); *G11C 16/0466* (2013.01);
(Continued)

(58) Field of Classification Search
CPC ......... H01L 21/02068; H01L 21/02164; H01L 21/02175; H01L 21/02178;
(Continued)

(56) References Cited

U.S. PATENT DOCUMENTS

2012/0056175 A1* 3/2012 Takemura ......... H01L 29/42324
257/43
2013/0264632 A1* 10/2013 Ding ................. H01L 29/66833
257/325

FOREIGN PATENT DOCUMENTS

CN       102593065 A    7/2012
CN       105206615 A   12/2015
(Continued)

OTHER PUBLICATIONS

International Search Report Issued in Counterpart PCT Application No. PCT/CN2017/119769.

*Primary Examiner* — Joseph M Galvin, III
(74) *Attorney, Agent, or Firm* — Amster, Rothstein & Ebenstein LLP

(57) ABSTRACT

A multi-level cell thin-film transistor memory and a method of fabricating the same, a structure of which memory comprises sequentially from down to top: a gate electrode, a charge blocking layer, a charge trapping layer, a charge tunneling layer, an active region, and source and drain electrodes; wherein the charge tunneling layer fully encloses the charge trapping layer so as to completely isolate the charge trapping layer from the ambience, which prevents change of physical properties and chemical compositions of the charge trapping layer during the annealing treatment, reduces loss of charges stored in the charge trapping layer, and enhances data retention property and device performance stability; a metal oxide semiconductor thin film is utilized as the charge trapping layer of the memory, which (Continued)

implements multi-level cell storage and improves storage density.

9 Claims, 2 Drawing Sheets

(51) Int. Cl.
    *H01L 21/28*     (2006.01)
    *G11C 11/56*     (2006.01)
    *G11C 16/04*     (2006.01)
    *G11C 16/10*     (2006.01)
    *G11C 16/14*     (2006.01)
    *H01L 21/02*     (2006.01)
    *H01L 21/027*     (2006.01)
    *H01L 21/465*     (2006.01)
    *H01L 21/4763*     (2006.01)
    *H01L 29/24*     (2006.01)
    *H01L 29/45*     (2006.01)
    *H01L 29/51*     (2006.01)
    *H01L 29/66*     (2006.01)
    *H01L 29/786*     (2006.01)
    *H01L 29/792*     (2006.01)

(52) U.S. Cl.
    CPC .............. *G11C 16/10* (2013.01); *G11C 16/14* (2013.01); *H01L 21/0228* (2013.01); *H01L 21/02068* (2013.01); *H01L 21/0274* (2013.01); *H01L 21/02175* (2013.01); *H01L 21/02194* (2013.01); *H01L 21/02266* (2013.01); *H01L 21/02565* (2013.01); *H01L 21/465* (2013.01); *H01L 21/47635* (2013.01); *H01L 29/24* (2013.01); *H01L 29/40117* (2019.08); *H01L 29/4234* (2013.01); *H01L 29/45* (2013.01); *H01L 29/513* (2013.01); *H01L 29/517* (2013.01); *H01L 29/66969* (2013.01); *H01L 29/7869* (2013.01); *H01L 29/7923* (2013.01); *H01L 21/02164* (2013.01); *H01L 21/02178* (2013.01); *H01L 21/02181* (2013.01); *H01L 21/02189* (2013.01)

(58) Field of Classification Search
    CPC ......... H01L 21/02181; H01L 21/02189; H01L 21/02194; H01L 21/02266; H01L 21/0228; H01L 21/02488; H01L 21/02554; H01L 21/02565; H01L 21/02631; H01L 21/0274; H01L 21/465; H01L 21/47635; H01L 27/11568; H01L 29/24; H01L 29/40117; H01L 29/4234; H01L 29/45; H01L 29/513; H01L 29/517; H01L 29/66969; H01L 29/78603; H01L 29/7869; H01L 29/7923
    See application file for complete search history.

(56) References Cited

FOREIGN PATENT DOCUMENTS

| | | |
|---|---|---|
| CN | 106560928 A | 4/2017 |
| CN | 107482014 A | 12/2017 |

* cited by examiner

MULTI-LEVEL CELL THIN-FILM TRANSISTOR MEMORY AND METHOD OF FABRICATING THE SAME

CROSS REFERENCE TO RELATED APPLICATIONS

This patent application is a U.S. national stage application under 35 U.S.C. § 371 of International Patent Application No. PCT/CN2017/119769 filed on Dec. 29, 2017, which claims the benefit of foreign priority to Chinese Patent Application No. CN 201710538920.2 filed Jul. 4, 2017. The International Application was published in Chinese on Jan. 10, 2019, as International Publication No. WO2019/007009 A1 under PCT Article 21(2).

FIELD

Embodiments of the present disclosure relate to the field of fabricating a semiconductor integrated circuit, and more particularly relate to a multi-level cell thin-film transistor memory and a method of fabricating the same.

BACKGROUND

As an important memory type, non-volatile memories are extensively applied to electronic products such as computers, mobile phones, mobile hard disks and to network infrastructure devices such as servers and network interconnecting devices. However, due to their complex fabrication processes and high processing temperatures, conventional silicon-based non-volatile memories cannot satisfy development requirements of fields such as next generation system-on-panels (SoPs) and future transparent and flexible electronic devices. In recent years, novel a-IGZO (amorphous indium gallium zinc oxide) semiconductor channel-based thin-film transistor (TFT) memories have become a hot topic in international researches. Owning to their advantages such as a simple fabrication process (without ion injection or doping), a lower processing temperature, a good visible light transitivity, and compatibility of their fabrication process with a TFT process, the a-IGZO semiconductor channel-based TFT memories have a wide application prospect in fields such as future SoPs and flexible transparent electronic devices.

Besides, storage density is also an important parameter of a memory. Conventionally, the storage density is improved mainly by downsizing a memory device and increasing the number of devices in a unit area. However, with constant downsizing of the devices, the device fabrication processes have become more and more complex, resulting in increasingly high fabrication costs. Therefore, an effective method of improving storage density is to realize multi-level cell (MLC) storage on a unity memory cell, which may not only improve the storage density, but also may lower the cost.

SUMMARY

An object of the present disclosure is to provide a multi-level cell thin-film transistor memory and a method of fabricating the same, the memory being configured for improving data retention property and memory performance stability, which may implement multi-level cell storage and improve storage density.

To achieve the object above, the present disclosure provides a multi-level cell thin-film transistor memory, a structure of which memory comprises sequentially from down to top: a gate electrode, a charge blocking layer, a charge trapping layer, a charge tunneling layer, an active region, and source and drain electrodes;

wherein, the charge tunneling layer fully encloses the charge trapping layer so as to completely isolate the charge trapping layer from the ambience; a material of the charge trapping layer is any one of ZnO, $In_2O_3$, $Ga_2O_3$, $SnO_2$, InSnO, or IGZO amorphous indium gallium zinc oxide).

In an embodiment of the multi-level cell thin-film transistor memory, a material of the gate electrode is P-type single crystal silicon wafer, glass, or PI flexible substrate.

In an embodiment of the multi-level cell thin-film transistor memory, a resistivity of the P-type single crystal silicon wafer is 0.001~0.005 Ω·cm.

In an embodiment of the multi-level cell thin-film transistor memory, a material of the charge blocking layer is $Al_2O_3$, $SiO_2$, $HfO_2$ or $ZrO_2$.

In an embodiment of the multi-level cell thin-film transistor memory, a material of the charge tunneling layer is $Al_2O_3$, $SiO_2$, $HfO_2$ or $ZrO_2$.

In an embodiment of the multi-level cell thin-film transistor memory, a material of the active region is IGZO.

In an embodiment of the multi-level cell thin-film transistor memory, a material of the source and drain electrodes is Ti/Au or Mo.

The present disclosure further provides a method of fabricating the multi-level cell thin-film transistor memory, comprising:

Step 1: fabricating a gate electrode;

Step 2: growing a charge blocking layer on the gate electrode resulting from step 1 by an atomic layer deposition (ALD), wherein a thickness of the charge blocking layer is 30~60 nm and its deposition temperature is 150~350° C.

Step 3: growing a charge trapping layer on the charge blocking layer resulting from step 2 by atomic layer deposition or magnetic sputtering deposition, wherein a thickness of the charge trapping layer is 10~40 nm.

Step 4: spin coating a layer of positive photoresist on the charge trapping layer resulting from step 3; then performing photolithography (exposing and developing) to define a region of the charge trapping layer; and next, removing portions beyond the defined charge trapping layer region by wet etching;

Step 5: growing a charge tunneling layer on the charging trapping layer resulting from step 4 and the exposed charge blocking layer by atomic layer deposition, wherein a thickness of the charge tunneling layer is 6~15nm and a deposition temperature is 150~350° C.

Step 6: growing a layer of IGZO thin film, which serves as an active layer of the memory, on the charge tunneling layer resulting from step 5 by magnetic sputtering deposition, then defining an active region by photolithography and wet etching to form an active channel of the memory, wherein a thickness of the IGZO thin film is 30~60 nm;

Step 7: spin coating a layer of negative photoresist on the IGZO thin film resulting from step 6; defining pattern regions of source and drain electrodes by photolithography; then, depositing a layer of metal thin film as a source and drain electrodes material by magnetic sputtering deposition or electron beam evaporation, and removing metal layers beyond the pattern regions of source and drain electrodes by a lift-off process to thereby form source and drain electrodes of the memory, wherein a thickness of the metal thin film is 50~200 nm.

Step 8: performing subsequent annealing treatment to the memory resulting from step 7, wherein an annealing atmosphere is oxygen or air, and an annealing temperature is 150~350° C., and an annealing duration is 60 s~2 h.

In the method of fabricating the multi-level cell thin-film transistor memory, the step 1 specifically comprises: with the P-type single crystal silicon wafer as a substrate, funning standard cleaning treatment to the gate electrode, or with the glass or PI flexible substrate as a substrate, depositing a layer of metal thereon and forming the gate electrode by photolithography and etching.

Compared with the prior art, the present disclosure has the following beneficial effects:

(1) the charging trapping layer of the thin-film transistor memory fabricated according to the present disclosure is fully enclosed by the charging tunneling layer, such that the former may be completely isolated from the ambiance, which prevents change of physical properties and chemical compositions of the charge trapping layer during the annealing treatment, reduces loss of charges stored in the charge trapping layer, and enhances data retention property and device performance stability;

(2) the present disclosure utilizes a metal oxide semiconductor thin film as the charge trapping layer of the memory, wherein one device unit may store multiple bits, thereby implementing the functionality of multi-level cell storage and improving storage density;

(3) the thin-film transistor memory fabricated by the present disclosure may be fabricated under a low temperature of less than 350° C., which lowers the thermal budget of device fabrication: besides, the thin-film transistor memory as fabricated is consistent with the material, processing temperature, and device structure adopted by a thin-film transistor (TFT) display; therefore, the fabrication process of the former is compatible with that of the TFT display. Besides, as the IGZO thin film has a relatively high visible light transmissivity, the present disclosure has a wide application prospect in fields such as future SoPs and flexible transparent electronic devices.

DETAILED DESCRIPTION OF EMBODIMENTS

Hereinafter, the present disclosure will be further described with reference to the preferred embodiments in conjunction with the accompanying drawings. These embodiments are only used for illustrating the present disclosure, not for limiting the protection scope of the present disclosure.

Figure 1:
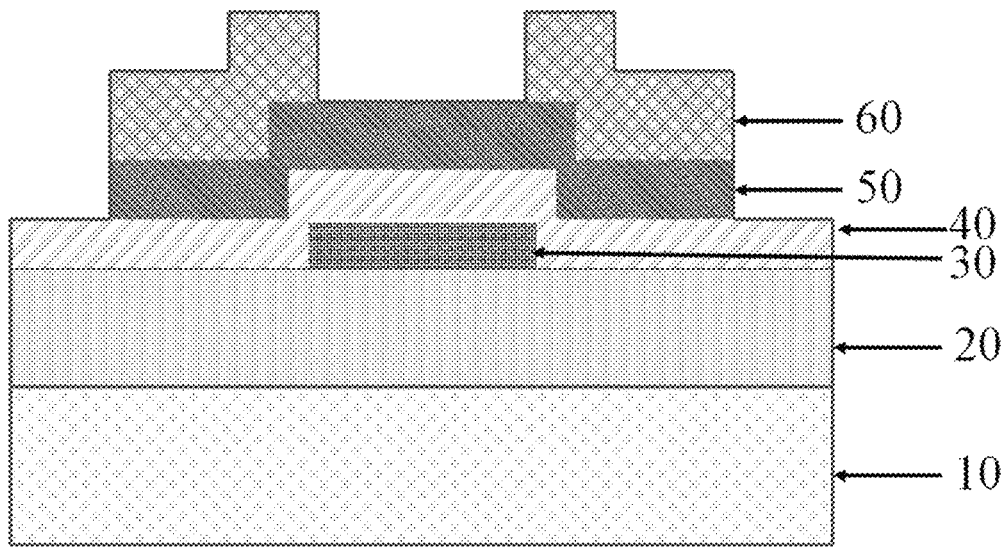
FIG. 1 shows a sectional schematic view of a multi-level cell unit memory structure.

As shown in FIG. 1, the present disclosure provides a multi-level cell thin-film transistor memory, a structure of which memory comprises sequentially from down to top: a gate electrode 10, a charge blocking layer 20, a charge trapping layer 30, a charge tunneling layer 40, an active region 50, and source and drain electrodes 60;

wherein the charge tunneling layer 40 fully encloses the charge trapping layer 30 so as to completely isolate the charge trapping layer 30 from the ambience; a material of the charge trapping layer 30 is any one of ZnO, $In_2O_3$, $Ga_2O_3$, $SnO_2$, InSnO, or IGZO.

In an embodiment of the multi-level cell thin-film transistor memory; a material of the gate electrode 10 is P-type single crystal silicon wafer, glass, or PI flexible substrate.

In an embodiment of the multi-level cell thin-film transistor memory, a resistivity of the P-type single crystal silicon wafer is 0.001~0.005 Ω·cm.

In an embodiment of the multi-level cell thin-film transistor memory, a material of the charge blocking layer 20 is $Al_2O_3$, $SiO_2$, $HfO_2$ or $ZrO_2$.

In an embodiment of the multi-level cell thin-film transistor memory, a material of the charge tunneling layer 40 is $Al_2O_3$, $SiO_2$, $HfO_2$ or $ZrO_2$.

In an embodiment of the multi-level cell thin-film transistor memory, a material of the active region 50 is IGZO.

In an embodiment of the multi-level cell thin-film transistor memory; a material of the source and drain electrodes 60 is Ti/Au or Mo, The present disclosure further provides a method of fabricating the multi-level cell thin-film transistor memory, comprising:

Step 1: fabricating a gate electrode 10;

Step 2: growing a charge blocking layer 20 on the gate electrode 10 resulting from step 1 by atomic layer deposition, wherein a thickness of the charge blocking layer 20 is 30~60 nm and its deposition temperature is 150~350° C.

Step 3: growing a charge trapping layer 30 on the charge blocking layer 20 resulting from step 2 by atomic deposition or magnetic sputtering deposition. Wherein a thickness of the charge trapping layer 30 is 10~40 nm.

Step 4: spin coating a layer of positive photoresist on the charge trapping layer 30 resulting from step 3; then performing photolithography to define a region of the charge trapping layer 30; and next, removing portions beyond the defined charge trapping layer 30 region by wet etching;

Step 5: growing a charge tunneling layer 40 on the charging trapping layer 30 resulting from step 4 and the exposed charge blocking layer 20 by atomic layer deposition, wherein a thickness of the charge tunneling layer 40 is 6~15 nm and a deposition temperature is 150~350° C.

Step 6: growing a layer of IGZO thin film, which serves as an active layer of the memory, on the charge tunneling layer 40 resulting from step 5 by magnetic sputtering deposition; then defining an active region 50 by photolithography and wet etching to form an active channel of the memory, wherein a thickness of the IGZO thin film is 30~60 nm;

Step 7: spin coating a layer of negative photoresist on the IGZO thin film resulting from step 6; defining pattern regions (opening regions) of source and drain electrodes 60 by photolithography ; then, depositing a layer of metal thin film as a source and drain electrodes 60 material by magnetic sputtering deposition or electron beam evaporation; and removing metal layers beyond the pattern regions of source and drain electrodes 60 by a lift-off process to thereby form source and drain electrodes of the memory, wherein a thickness of the metal thin film is 50~200 nm;

Step 8: performing subsequent annealing treatment to the memory resulting from step 7, wherein an annealing atmosphere is oxygen or air, and an annealing temperature is 150~350° C., and an annealing duration is 60 s~2 h;

In the method of fabricating the multi-level cell thin-film transistor memory, the step 1 specifically comprises: with the P-type single crystal silicon wafer as a substrate, forming the gate electrode 10 by standard cleaning, or with the glass or PI flexible substrate as a substrate, depositing a layer of metal thereon and forming the gate electrode 10 by photolithography and etching.

Embodiment I

This embodiment utilizes ZnO thin film as the charge trapping layer 30, a specific fabrication process thereof comprising:

Step 1: with a P-type single crystal silicon wafer with a transmittance of 0.001~0.005 Ω·cm as a substrate, performing RCA cleaning treatment to the substrate to form a gate electrode 10;

Step 2: growing a layer of $Al_2O_3$ thin film, which serves as a charge blocking layer 20, on the gate electrode 10 by ALD; the deposition temperature is 150~350° C., preferably 300° C.; a thickness of the thin film is 30~60 nm, preferably 35 nm;

Step 3: growing a layer of ZnO thin film, which serves as a charge trapping layer 30, on the charge blocking layer 20 by the ALD method or a PVD method; the deposition temperature is 150~350° C., preferably 200° C.; the thin film has a thickness of 10~40 nm, preferably 20 nm;

Step 4: spin coating a layer of positive photoresist on the charge trapping layer 30; then performing exposing and developing to define a region of the charge trapping layer 30 of the memory, and next, removing portions beyond the defined charge trapping layer 30 region using diluted hydrochloric acid;

Step 5: growing, by ALD, a layer of $Al_2O_3$ thin film, which serves as a charge tunneling layer 40, on the charge trapping layer 30 and the charge blocking layer 20 which is exposed after being etched with the diluted hydrochloric acid, wherein the deposition temperature is 150~350° C., preferably 300° C.; and a thickness of the thin film is 6~15 nm, preferably 8 nm;

Step 6: growing a layer of IGZO thin film, which serves as an active layer, on the charge tunneling layer 40 by PVD, wherein an atomic ratio in an IGZO target material is In:Ga:Zn:O=1:1:1:4, a sputtering power is 110 W, a working pressure is 0.88 Pa, and the fluxes of Ar and O2 introduced in a deposition chamber are 50 sccm and 0 sccm, respectively; and defining an active region 50 by photolithography and wet etching to form an active channel of the memory, wherein a thickness of the IGZO thin film is 30~60 nm, preferably 40 nm;

Step 7: spin coating a layer of negative photoresist on the IGZO thin film; defining pattern regions (opening regions) of source and drain electrodes 60 by photolithography; then, blanket depositing a layer of Ti/AU dual-layer metal thin film as a source and drain electrodes 60 material by magnetic sputtering deposition or electron beam evaporation, wherein the thickness of the metal thin film is 50~200 nm, preferably 100 nm; then, removing metal layers beyond the pattern regions of source and drain electrodes 60 by a lift-off process to thereby form source and drain electrodes 60 of the memory;

Step 8: performing subsequent annealing treatment to the memory, therein annealing atmosphere is oxygen (O2), an annealing temperature is 150~350° C., preferably 250° C.; and an annealing duration is 60~600 s, preferably 300 s.

Figure 2:
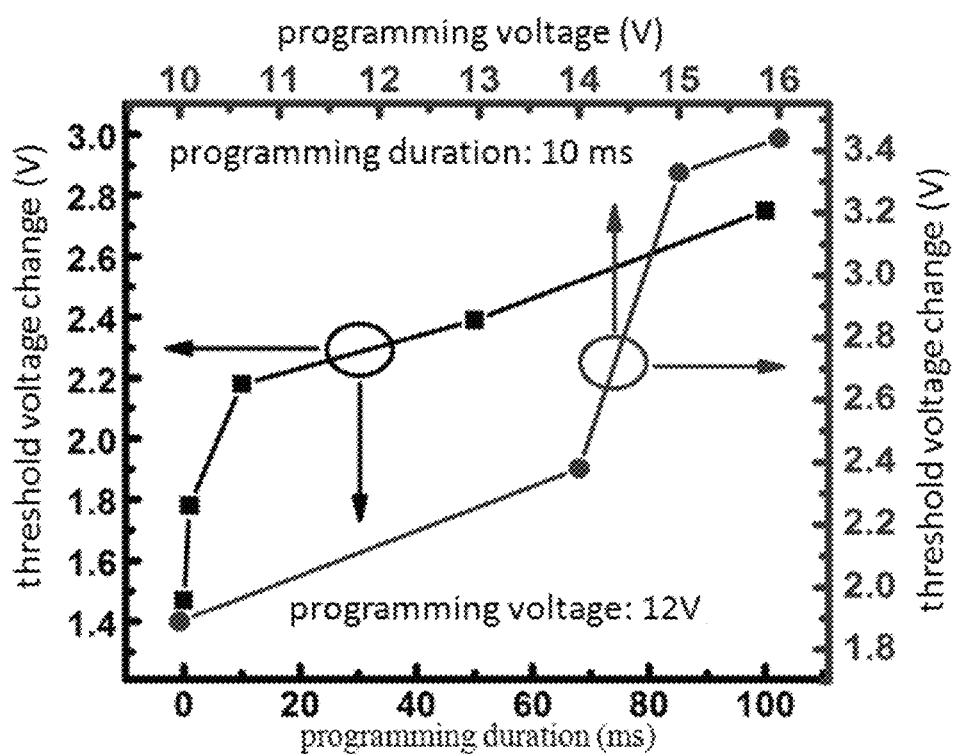
FIG. 2 shows a curve chart of a programming property of a ZnO charge trapping layer-based multi-level cell memory.

FIG. 2 shows a programming property of the memory fabricated in Embodiment I. When the programming voltage is fixed at 12V and the programming duration increases from 0.001 ms to 100 ms, the programming window (a difference between the programmed threshold voltage and the initial-state threshold voltage) increases from 1.47 V to 2.75 V; when the fixed programming duration is 10 ms and the programming voltage increases from 10V to 16V, the programming window increases from 1.89V to 3.44V This indicates that the memory has a good programming property.

Figure 3:
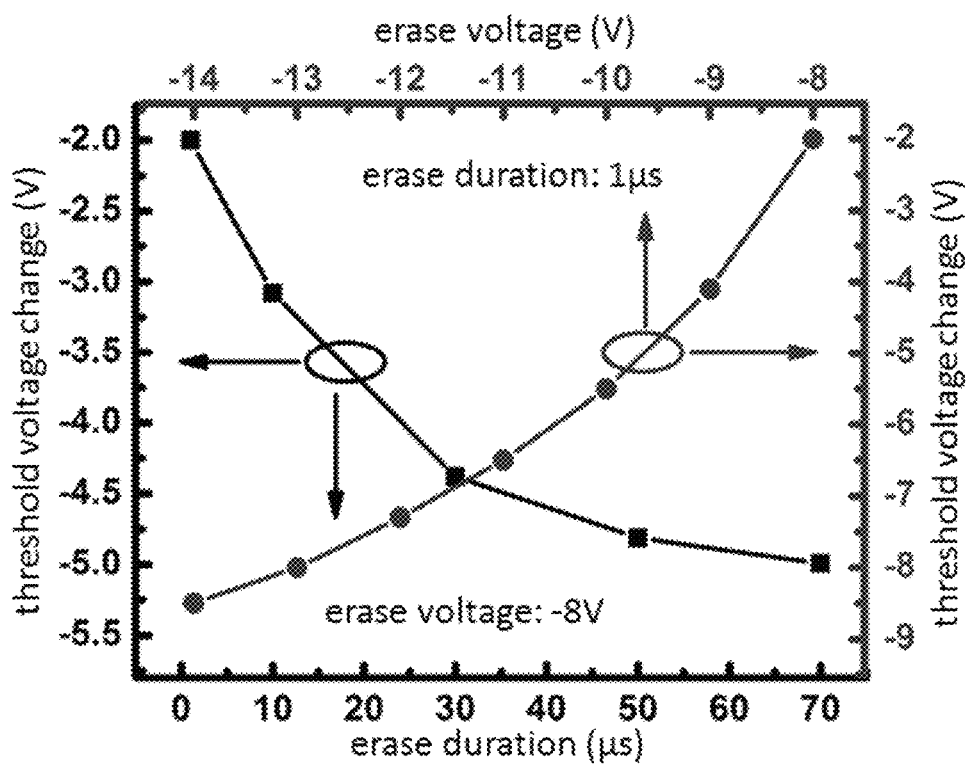
FIG. 3 shows a curve chart of an erase property of the ZnO charge trapping layer-based multi-level cell memory.

FIG. 3 shows an erase property of the memory fabricated in Embodiment I. When the erase voltage is fixed at −8V and the erase duration increases from 1 μs to 70 μs, the erase window (a difference between the erase threshold voltage and the initial-state threshold voltage) increases from 2V to 4.99V; when the fixed erase duration is 10 ms and the erase voltage increases from −8V to −14V, the erase window increases from 2V to 8.5V. This indicates that the memory fabricated in Embodiment I has a very high electrical erase efficiency.

Figure 4:
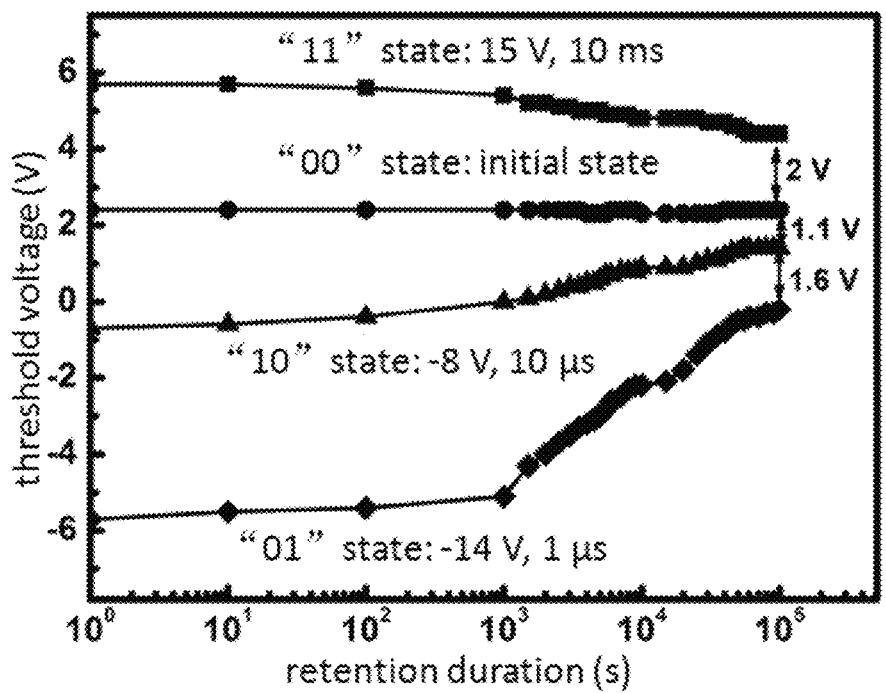
FIG. 4 shows a curve chart of a charge retention property of the ZnO charge trapping layer-based multi-level cell memory.

By changing a bias pulse on the gate, four states may be realized, i.e., "00," "11," "10," and "01" states. Here, the memory initial state is defined as "00" state; the memory programming state is defined as "11" state (e.g., 15V/10 ms); a low negative bias pulse (e.g., −8V/10 μs) erase state is defined as "10"; and a high negative bias pulse (e.g., −14 V/1 μs) erase state is defined as "01" state. FIG. 4 shows charge retention properties under different storage states of the memory fabricated in Embodiment I. The operation condition of the "11" state is 15V/10 ms; the operation state of the "00" state is the memory initial state; and the operation conditions of "10" state and "01" state are −8 V/10 μs and −14 V/1 μs, respectively. It may be seen from FIG. 1 that when the retention time reaches 105 s, the storage window of the memory from "11" state to "00" state is 2V; the storage window from the "00" state to "10" state is 1.1V; and the storage window from the "10" state to the "01" state is 1.6V. This enables the memory to normally distinguish the four different storage states of "00, " "11, " "10," and "01."

Embodiment II

This embodiment utilizes IGZO thin film as the charge trapping layer 30, a specific fabrication process thereof comprising:

Step 1: with a P-type single crystal silicon wafer with a transmittance of 0.001~0.005 Ω·cm as a substrate, performing RCA cleaning treatment to the substrate to form a gate electrode 10;

Step 2: growing a layer of $Al_2O_3$ thin film, which serves as a charge blocking layer 20, on the gate electrode 10 by ALD the deposition temperature is 150~350° C., preferably 300° C.; a thickness of the thin film is 30~60 nm, preferably 35 nm;

Step 3: growing a layer of IGZO thin film, which serves as a charge trapping layer 30, on the charge blocking layer 20 by PVD, wherein an atomic ratio in an IGZO target material is In:Ga:Zn:O=1:1:1:4, a sputtering power is 110 W, a working pressure is 0.88 Pa, and the fluxes of Ar and $O_2$ introduced in a deposition chamber are 50 sccm and 0 sccm, respectively; wherein the thickness of the IGZO thin film is 10~40 nm, preferably 20 nm;

Step 4: spin coating a layer of positive photoresist on the charge trapping layer 30; then performing exposing and developing to define a region of the charge trapping layer 30 of the memory, and next, removing portions beyond the defined charge trapping layer 30 region using diluted hydrochloric acid;

Step 5: growing, by ALD, a layer of $Al_2O_3$ thin film, which serves as a charge tunneling layer 40, on the charge trapping layer 30 and the charge blocking layer 20 which is exposed after being etched with the diluted hydrochloric acid; the deposition temperature is 150~350° C., preferably 300° C.; a thickness of the thin film is 6~15 nm, preferably 8 nm;

Step 6: growing a layer of IGZO thin film, which serves as an active layer, on the charge tunneling layer 40 by PVD, wherein an atomic ratio in an IGZO target material is In:Ga:Zn:O=1:1:1:4, a sputtering power is 110 W, a working pressure is 0.88 Pa, and the fluxes of Ar and $O_2$ introduced in a deposition chamber are 50 sccm and 0 sccm, respectively; defining an active region 50 by photolithography and wet etching to form an active channel of the memory, wherein the thickness of the IGZO thin film is 30~60 nm, preferably 40 nm;

Step 7: spin coating a layer of negative photoresist on the IGZO thin film; defining pattern regions (opening regions) of source and drain electrodes 60 by photolithography; then, blanket depositing a layer of Mo metal thin film as a source and drain electrodes 60 material by magnetic sputtering deposition or electron beam evaporation, wherein the thickness of the metal thin film is 50~200 nm, preferably 100 nm; then, removing metal layers beyond the pattern regions of source and drain electrodes 60 by a lift-off process to thereby form source and drain electrodes 60 of the memory;

Step 8: performing subsequent annealing treatment to the memory, wherein an annealing atmosphere is air, an annealing temperature is 150~350° C., preferably 300° C., and an annealing duration is 0.5~2 h, preferably 1 h.

By performing different voltage programming to the memory fabricated in Embodiment 2, different states may be implemented. For example, when a 12V 10 ms pulse is applied to the gate, the memory changes from the initial state to the programming state; besides, the two states may he mutually converted (wherein the voltage pulse condition for restoring the initial state is −12V, 20 ms); when a −15V 10 ms pulse is applied to the gate, the memory changes from the initial state to the erase state; besides, the two states may also be mutually converted (wherein the voltage pulse condition for restoring the initial state is 11V, 15 ms). Table 1 lists retention properties of the memory fabricated in Embodiment II under different states. As the retention duration extends from 0 second to $10^5$ seconds, the threshold voltages ($V_{th}$) of the programming state, initial state, and erase state change from 2.276 V, −0.09 V, −2.4 V to 1.574 V, −0.339 V, −1.634 V, respectively, which reflect a good stability.

TABLE 1

Retention Properties of ZnO Charge Trapping Layer-Based Multi-Level Cell

|  | Programming State Threshold Voltage ($V_{th}$) | Initial State Threshold Voltage ($V_{th}$) | Erase State Threshold Voltage ($V_{th}$) |
| --- | --- | --- | --- |
| Gate Voltage Pulse | 12 V, 10 ms | N/A | −15 V, 10 ms |
| 0 Second | $V_{th}$ = 2.276 V | $V_{th}$ = −0.09 V | $V_{th}$ = −2.4 V |
| $10^5$ seconds | $V_{th}$ = 1.574 V | $V_{th}$ = −0.339 V | $V_{th}$ = −1.634 V |

In view of the above, as the charging trapping layer of the thin-film transistor memory fabricated according to the present disclosure is fully enclosed by the charging tunneling layer, the former may be completely isolated from the ambiance, which prevents change of physical properties and chemical compositions of the charge trapping layer during the processing process, reduces loss of charges stored in the charge trapping layer, and enhances data retention property and memory performance stability; the present disclosure utilizes a metal oxide semiconductor thin film as the charge trapping layer of the memory, which implements multi-level cell storage and improves storage density; the thin-film transistor memory fabricated according to the present disclosure may be fabricated under a temperature lower than 350° C., which lowers the thermal budget of memory fabrication; besides, the fabrication process is compatible with the thin-film transistor process. Further, as the IGZO thin film has a relatively high visible light transmissivity, the present disclosure has a wide application prospect in fields such as future SoPs and flexible transparent electronic devices.

Although the contents of the present disclosure have been described in detail through the foregoing preferred embodiments, it should be understood that the depictions above shall not be regarded as limitations to the present disclosure. After those skilled in the art having read the contents above, many modifications and substitutions to the present disclosure are all obvious. Therefore, the protection scope of the present disclosure should be limited by the appended claims.

We claim:

1. A multi-level cell thin-film transistor memory, a structure of which memory comprises sequentially from down to top: a gate electrode, a charge blocking layer, a charge trapping layer, a charge tunneling layer, an active region, and source and drain electrodes; the memory is fabricated by annealing treatment;

wherein, the charge tunneling layer fully encloses the charge trapping layer so as to completely isolate the charge trapping layer from the ambience to prevent change of physical properties and chemical compositions of the charge trapping layer during the annealing treatment and reduce loss of charges stored in the charge trapping layer; a material of the charge trapping layer is any one of ZnO, $In_2O_3$, $Ga_2O_3$, $SnO_2$, InSnO, or IGZO (amorphous indium gallium zinc oxide).

2. The multi-level cell thin-film transistor memory according to claim 1, wherein a material of the gate electrode is P-type single crystal silicon wafer, glass, or PI flexible substrate.

3. The multi-level cell thin-film transistor memory according to claim 2, wherein a resistivity of the P-type single crystal silicon wafer is 0.001~0.005 Ω·cm.

4. The multi-level cell thin-film transistor memory according to claim 1, wherein a material of the charge blocking layer is $Al_2O_3$, $SiO_2$, $HfO_2$ or $ZrO_2$.

5. The multi-level cell thin-film transistor memory according to claim 1, wherein a material of the charge tunneling layer is $Al_2O_3$, $SiO_2$, $HfO_2$ or $ZrO_2$.

6. The multi-level cell thin-film transistor memory according to claim 1, wherein a material of the active region is IGZO.

7. The multi-level cell thin-film transistor memory according to claim 1, wherein a material of the source and drain electrodes is Ti/Au or Mo.

8. A method of fabricating the multi-level cell thin-film transistor memory, comprising:

Step 1: fabricating a gate electrode;

Step 2: growing a charge blocking layer on the gate electrode resulting from step 1 by atomic layer deposition, wherein a thickness of the charge blocking layer is 30~60nm and its deposition temperature is 150~350° C.;

Step 3: growing a charge trapping layer on the charge blocking layer resulting from step 2 by atomic deposition or magnetic sputtering deposition, wherein a thickness of the charge trapping layer is 10~40nm;

Step 4: spin coating a layer of positive photoresist on the charge trapping layer resulting from step 3; then performing photolithography (exposing and developing) to define a region of the charge trapping layer; and next, removing portions beyond the defined charge trapping layer region by wet etching;

Step 5: growing a charge tunneling layer on the charging trapping layer resulting from step 4 and the exposed charge blocking layer by atomic layer deposition, wherein a thickness of the charge tunneling layer is 6~15nm and a deposition temperature is 150~350° C.;

Step 6: growing a layer of IGZO thin film, which serves as an active layer of the memory, on the charge tunneling layer resulting from step 5 by magnetic sputtering deposition, then defining an active region by photolithography and wet etching to form an active channel of the memory, wherein a thickness of the IGZO thin film is 30~60nm;

Step 7: spin coating a layer of negative photoresist on the IGZO thin film resulting from step 6; defining pattern regions of source and drain electrodes by photolithography; then, depositing a layer of metal thin film as a source and drain electrodes material by magnetic sputtering deposition or electron beam evaporation, and removing metal layers beyond the pattern regions of source and drain electrodes by a lift-off process to thereby form source and drain electrodes of the memory, wherein a thickness of the metal thin film is 50~200nm;

Step 8: performing subsequent annealing treatment to the memory resulting from step 7, wherein an annealing atmosphere is oxygen or air, and an annealing temperature is 150~350° C., and an annealing duration is 60s~2h.

9. The method of fabricating the multi-level cell thin-film transistor memory according to claim 8, wherein the step 1 specifically comprises: with the P-type single crystal silicon wafer as a substrate, performing standard cleaning treatment to form the gate electrode, or with the glass or PI flexible substrate as a substrate, depositing a layer of metal thereon and forming the gate electrode by photolithography and etching.

* * * * *